(12) United States Patent
Abeyasekera et al.

(10) Patent No.: US 9,666,504 B2
(45) Date of Patent: May 30, 2017

(54) HEAT SINK FOR COOLING OF POWER SEMICONDUCTOR MODULES

(75) Inventors: Tusitha Abeyasekera, Aarhus N (DK); Thomas Lundgren Anderson, Hinnerup (DK); Henrik B. Møller, Vejle (DK); Ove Styhm, Hadsten (DK)

(73) Assignee: VESTAS WIND SYSTEMS A/S, Aarhus N (DK)

( * ) Notice: Subject to any disclaimer, the term of this patent is extended or adjusted under 35 U.S.C. 154(b) by 216 days.

(21) Appl. No.: 14/125,255

(22) PCT Filed: Jul. 2, 2012

(86) PCT No.: PCT/DK2012/050242
§ 371 (c)(1),
(2), (4) Date: Apr. 1, 2014

(87) PCT Pub. No.: WO2013/000484
PCT Pub. Date: Jan. 3, 2013

(65) Prior Publication Data
US 2014/0204533 A1   Jul. 24, 2014

Related U.S. Application Data

(60) Provisional application No. 61/502,900, filed on Jun. 30, 2011.

(30) Foreign Application Priority Data

Jun. 30, 2011   (DK) .................. 2011 70339

(51) Int. Cl.
*H02B 1/56*   (2006.01)
*H05K 7/20*   (2006.01)
(Continued)

(52) U.S. Cl.
CPC .......... *H01L 23/34* (2013.01); *H01L 23/3735* (2013.01); *H01L 23/473* (2013.01);
(Continued)

(58) Field of Classification Search
None
See application file for complete search history.

(56) References Cited

U.S. PATENT DOCUMENTS 4,854,377 A  *  8/1989  Komoto ................ H01L 23/433
                                                        165/185
5,146,981 A       9/1992  Samarov
(Continued)

FOREIGN PATENT DOCUMENTS

EP       0805492 A2    11/1997
EP       1434266 A1     6/2004
(Continued)

OTHER PUBLICATIONS

International Search Report issued in corresponding application No. PCT/DK2012/050242, mailed Nov. 7, 2012, 3 pages.
(Continued)

*Primary Examiner* — Courtney Smith
(74) *Attorney, Agent, or Firm* — Patterson + Sheridan, LLP

(57) ABSTRACT

A heat sink for cooling at least one power semiconductor module, and that includes a basin for containing a cooling liquid. The basin has a contact rim for receiving the base plate and that includes a surface that is sloped inwards to the basin.

13 Claims, 5 Drawing Sheets

(51) Int. Cl.
    *H01L 23/367*     (2006.01)
    *H01L 23/34*     (2006.01)
    *H01L 23/373*     (2006.01)
    *H01L 23/473*     (2006.01)
    *H01L 25/065*     (2006.01)
    *H01L 23/00*     (2006.01)

(52) U.S. Cl.
    CPC .......... *H01L 25/0655* (2013.01); *H01L 24/32* (2013.01); *H01L 24/48* (2013.01); *H01L 24/73* (2013.01); *H01L 2224/32225* (2013.01); *H01L 2224/48227* (2013.01); *H01L 2224/48472* (2013.01); *H01L 2224/73265* (2013.01); *H01L 2924/00014* (2013.01); *H01L 2924/10253* (2013.01); *H01L 2924/12041* (2013.01); *H01L 2924/13055* (2013.01); *H02B 1/56* (2013.01); *H05K 7/20* (2013.01)

(56) References Cited

U.S. PATENT DOCUMENTS

| | | | | |
|---|---|---|---|---|
| 5,966,291 | A * | 10/1999 | Baumel | H05K 7/20927 165/80.3 |
| 5,981,036 | A | 11/1999 | Schulz-Harder et al. | |
| 6,434,003 | B1 * | 8/2002 | Roy | H05K 7/20927 165/104.22 |
| 6,583,505 | B2 | 6/2003 | Choi | H01L 23/13 257/706 |
| 7,173,823 | B1 * | 2/2007 | Rinehart | F28D 9/0031 165/80.4 |
| 7,755,185 | B2 * | 7/2010 | Bayerer | H01L 23/373 257/714 |
| 7,876,561 | B2 * | 1/2011 | Schnetzka | F25B 49/025 180/297 |
| 9,003,649 | B1 * | 4/2015 | Romero | B23K 20/122 29/830 |
| 9,042,100 | B2 * | 5/2015 | Kang | H05K 7/20 257/713 |
| 2001/0014029 | A1 * | 8/2001 | Suzuki | H02M 7/003 363/141 |
| 2003/0153128 | A1 | 8/2003 | Ito | |
| 2005/0180104 | A1 * | 8/2005 | Olesen | F28F 3/12 361/699 |
| 2006/0126309 | A1 * | 6/2006 | Bolle | H05K 9/0033 361/719 |
| 2007/0062674 | A1 * | 3/2007 | Ippoushi | H01L 23/473 165/80.4 |
| 2008/0079021 | A1 * | 4/2008 | Bayerer | H01L 23/373 257/177 |
| 2008/0237847 | A1 | 10/2008 | Nakanishi et al. | |
| 2010/0208427 | A1 * | 8/2010 | Horiuchi | H05K 7/20927 361/699 |
| 2010/0277868 | A1 * | 11/2010 | Beaupre | H01L 23/473 361/700 |
| 2010/0302741 | A1 | 12/2010 | Kanschat et al. | |
| 2012/0218714 | A1 * | 8/2012 | Robert | H01L 23/053 361/713 |
| 2013/0056185 | A1 * | 3/2013 | Bayerer | H01L 23/36 165/134.1 |

FOREIGN PATENT DOCUMENTS

| | | |
|---|---|---|
| EP | 1790935 A2 | 5/2007 |
| JP | 158229 | 5/2003 |
| JP | 227336 | 9/2008 |

OTHER PUBLICATIONS

Danish Search Report issued in corresponding application No. PA 2011 70339, mailed Feb. 9, 2012, one page.

\* cited by examiner

HEAT SINK FOR COOLING OF POWER SEMICONDUCTOR MODULES

FIELD

The present invention relates to a heat sink for cooling power semiconductor module(s).

BACKGROUND

Semiconductor devices generate heat during operation, and this heat usually acts to degrade the operation of the semiconductor device. For power semiconductor devices, heat removal may prove beneficial to maintain acceptable device performance. Large power semiconductors often consist of a high number of silicon chips or dies connected in series or parallel, depending on the use, and may be attached to a common board. Such large power semiconductors are often called power modules.

Liquid cooling of power semiconductors often involves having a heat sink attached to the bottom of the power semiconductor module, i.e. the base plate of the module. The heat sink contains a closed circuit for a liquid coolant that may include inlet(s) and outlet(s) for providing fluid connections to a heat exchanger. This method is known as indirect cooling.

Direct cooling of power semiconductor modules is also practiced, and involves a chamber for the liquid coolant defined in a basin of the heat sink. The base plate of the power semiconductor module may be attached to the heat sink over the basin, effectively acting as a lid to cover the basin and placing the coolant in the basin in thermal contact with the base plate for heat removal therefrom. Fasteners, such as bolts or screws, are often used to secure the heat sink and base plate.

The actual flow and/or heat transfer of the liquid coolant can be made in many different ways, one way is by using a distributing element, which is inserted in the basin, and another known way is by having an array of cooling fins protruding from the base plate into the liquid coolant. Such a distributing element is disclosed in EP 2207201.

SUMMARY OF THE INVENTION

According to one aspect, a heat sink is disclosed for cooling at least one power semiconductor module with a base plate. The heat sink includes a basin for containing a cooling liquid and a contact rim that lies around the basin and that receives the base plate, the contact rim having a slope inwards to the basin.

In some embodiments, the slope corresponds to a convex bending of a base plate of the power semiconductor module. The angle of said slope may be in the range of 0.1 degrees to 3 degrees, or between 0.5 degrees to 1.5 degrees.

The basin, according to some embodiments, may include an outlet for allowing circulation of a liquid coolant.

A recessed rim for receiving a gasket may be incorporated into the heat sink bout the basin, and may accommodate a double gasket containing an inner and an outer gasket. The gasket may be made of EPDM rubber with a plastic carrier, according to some embodiments.

DETAILED DESCRIPTION OF THE INVENTION

Figure 1:
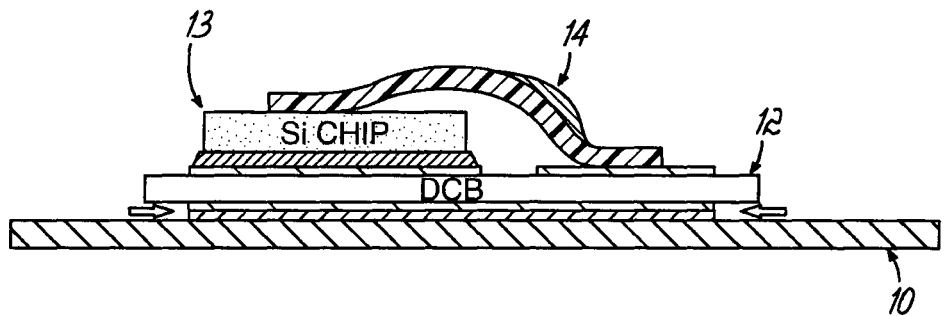
FIG. 1 shows a drawing of the structure of a power semiconductor made with DCB.

Aspects of the invention relates to a heat sink, especially for liquid cooling of power semiconductors modules. The power semiconductor module(s) are mounted on a first side of a base plate that, in turn, is mounted to a heat sink on a second side of the base plate. The heat sink includes a basin that holds coolant in thermal contact with the second side of the base plate to remove heat from the power semiconductor module. A sealed joint between the base plate and the heat sink is formed, such as by a gasket, to avoid leaks of the liquid coolant.

According to an aspect of the invention, a surface of the heat sink that surrounds the basin and that faces the base plate when mounted thereto, includes a contact surface that is sloped toward the basin. The applicant has appreciated that fasteners used to hold the heat sink to the base plate may cause warping of the base plate when the fasteners are executed.

According to some embodiments, the heat sink may be connected to a base plate that is has been bonded using Direct Copper Bonding (DCB), or in some part of the world DBC, Direct Bond Copper, and denotes a process in which copper and a ceramic material are directly bonded. Normally, DCB has two layers of copper that are directly bonded onto an aluminium-oxide (Al2O3) or aluminium-nitride (AlN) ceramic base. The DCB process yields a super-thin base and eliminates the need for the thick, heavy copper bases that were used prior to this process. Because power modules with DBC bases have fewer layers, they have much lower thermal resistance values and because the expansion coefficient matches silicon, they have much better power cycling capabilities (up to 50,000 cycles).

Direct copper bonded substrates are thick copper foil clad ceramics using either alumina (Al2O3) or aluminum nitride (AlN) ceramics intended for very high power microelectronic applications such as power supplies, radar systems, thermoelectric coolers, solar cell, high luminosity LEDS and other applications. The copper is bonded in nitrogen furnaces above 1000 degree Centigrade which limit the copper foil thicknesses from 5 to 12 mils thick. This thickness copper limits photo patterning and etching effectively to minimum 10 mil lines and spacing. Copper can be chemically etched down to 3 mil thick copper foil for some tighter patterning requirements in RF and microwave applications. The DCB bond to ceramic is tenacious being one of the strongest bonds of any metal in thick film or thin film metallurgy. Being directly bonded to ceramic without adhesives or thick film interlayer it provides an excellent thermal path to the heat sink 3. The copper foil can be etched with ferric chloride or copper chloride although the copper is so thick it is more commonly referred to as copper milling.

An advantage of DCB is that the 0.3 mm thick copper layer permits higher current loading for the same conductor width. Assuming the same copper cross-section the conductor needs to be only 12% of that of a normal printed circuit board.

FIG. 1 shows the layered structure of a DCB mounted semi conductor, e.g. could be a power diode or an IGBT or any other type of Silicon chip. The bottom is a copper base plate 10 on which the ceramic DCB plate 12 is soldered onto. On the DCB there might me conducting copper patches, like on a printed circuit board. The silicon chip 13 is soldered onto the DCB 12 and the active parts of the silicon chip is connected by bonding wires 14.

One of the problems of using direct cooling together with large power modules is that the mechanical force needed to seal the cooling system can cause mechanical stresses in the base plate 10 as the base plate 10 bends due to the forces from the screws. This effect is most often seen when using power modules with a pre-bend base plate 10.

High pressure, especially pulses, of the liquid coolant can also cause the base plate 10 to bend, so it is important that the base plate 10 can withstand the required pressure of the coolant.

Figure 2:
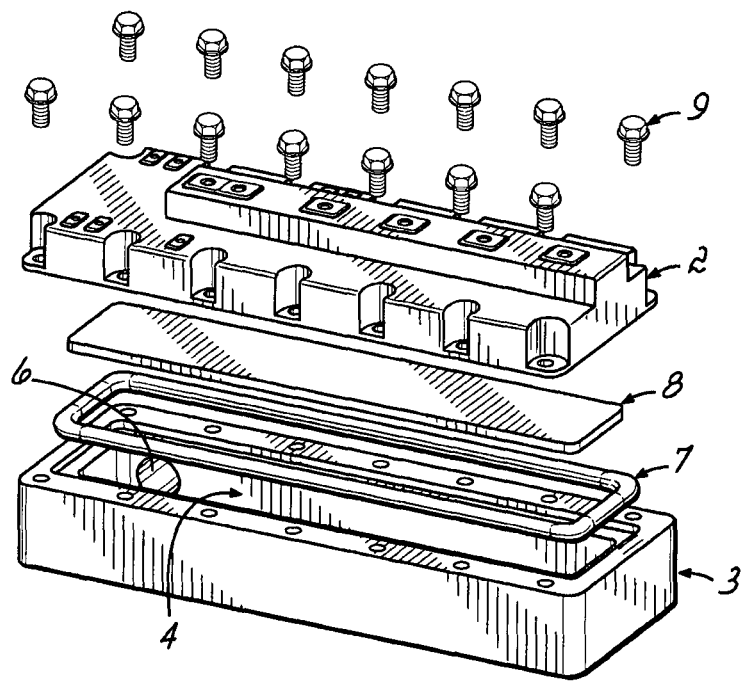
FIG. 2 shows a cross section of a direct cooling heat sink with gasket and power module.

FIG. 2 shows the build up of a direct cooling heat sink 3. The heat sink 3 includes a basin 4 and an inlet/outlet 6. A gasket 7 is inserted between the heat sink 3 and the power module 2. To ensure an even distribution of the liquid coolant, a flow distributing element 8 is inserted in the basin 4. The power module is screwed or bolted to the heat sink 3 by bolts or screws 9.

Bending stress due to power module 2 mounting screws 9 combined with the force exerted by a gasket 7 and pressure pulses from the coolant on the baseplate can cause the brittle thin Ceramic substrate material to crack, violating electrical insulation properties and destroying the device instantaneously.

An embodiment of the present invention addresses the issue that power semiconductor modules 2 often are mounted on a pre-bend base plate 10. The reason for having a pre-bend base plate 10 is that standard power semiconductor modules 2 often are mounted to a heat sink using indirect cooling; this may be a liquid cooled or an air cooled type of heat sink 2. When the power semiconductor module is made with a pre-bended shape it helps to ensure that the thermal paste, used for heat transfer, is evenly distributed and thus air pockets are avoided.

For direct cooling is often practical to use a power module with a pre-bend base plate 10 as they are more common, and use of standard components is preferred as it eases the supply chain both for manufacturing and spare parts.

When attaching a pre-bend base plate 10 to the direct cooling heat sink with a flat upper edge of the basin, forces from the bolts or screws, combined with a gasket acting as a fulcrum, will try to flatten out the base plate 10 which will cause the ceramic chip substrate to crack and result in isolation failure. A solution to this would be to increase the thickness of the baseplate and thus increasing the bending strength. However this will increase the thermal resistance degrading the thermal performance and add cost and weight to the product. A more effective solution to the present problem is to make a contact rim of the basin with a slope that equals the angle of the pre-bending of the base plate 10; this will ensure a good contact between the base plate 10 and the heat sink 3.

One embodiment describes a 1 deg slope used on either sides of the heat sink seat where the IGBT device sits on the direct cooling converter for wind turbines. The purpose of the 1 deg slope is to align the heat sink with the natural inclination of the IGBT baseplate, such that the bending stress on the device is reduced considerably. The method allows the IGBTs in the direct cooled application to be assembled with no cracks in the Silicon.

Other embodiments may have slopes with other angles depending on the shape of the base plate 10, such as angles in the range of 0.1 degrees to 3 degree, it all depends on the shape of the base plate 10.

The above method is a unique method to produce a direct cooled IGBT converter with enough margins on the bending stress, moving to automated production with no crack failures in the IGBTs.

Direct cooling of IGBTs allows for high power density (high MWs for less volume and weight). This again leads to low number of devices per electrical phase, and thus reducing cost for a given MW rating+longer lifetime due to low average IGBT chip 13 temperature.

An advantage of the present invention is that longer service interval can be scheduled as a consequence of the increased reliability of IGBTs using direct cooling. indirect cooling of IGBTs using thermal interface paste. The bending stress limits of the silicon 13 in the IGBT are not exceeded since the forces are equally distribution when mounting the device in a flat surface.

A disadvantage of the indirect cooling of IGBT power modules is that the method requires use of thermal interface paste, to ensure proper heat transfer from the power module to the heat sink. The bending stress limits of the ceramic substrate material (right column in FIG. 7) in the IGBT power module is not exceeded since the forces are equally distribution when mounting the device in a flat surface.

Figure 3:
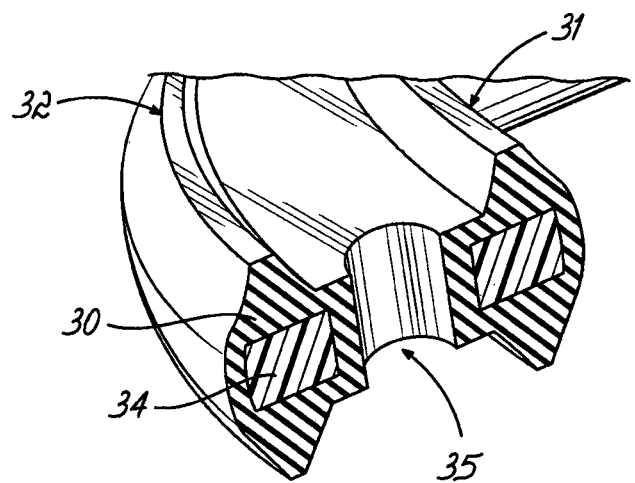
FIG. 3 shows a cross section of double gasket with plastic carrier.

FIG. 3 shows a gasket 7 that may be used in an embodiment of the present invention. The gasket 7 is designed as a double gasket. The double gasket 7 acts as a reliable seal between the pressurised liquid coolant and the outside. Two barriers 31, 32 in the gasket provide a degree of redundancy against breach of seal. The pressurised inner gasket ring 31 sees most of the force from the liquid coolant, the pressure less outer gasket ring 32 more works as a redundant seal. Between the inner and outer gasket rings 31, 32 there are a rubber material same a used for the gasket itself, there are thru holes 35 for leakage draining between top and bottom side of the gasket 7. The double gasket 7 may in one embodiment of the present invention be made out of EPDM rubber. The gasket is in one embodiment made with a plastic carrier 34. The plastic carrier 34 ensures that the gasket maintains its shape and makes it easy to insert into a recess during assembly of the heat sink 3 together with the power module 2.

The key feature of the present invention is to have an attachment or contact rim 1 around the basin 4 of the heat sink 3, where the contact rim 1 is having a slope with an angle inwards to the basin 4, to compensate for the pre-bend of the base plate 10. In one embodiment the slope corresponds to the convex bending of the base plate 10. In another embodiment the slope has a fixed angle 20 inwards to the basin. The angle is defined as the angular difference between a flat contact rim and the angle 20 shown in FIG. 5.

Figure 4:
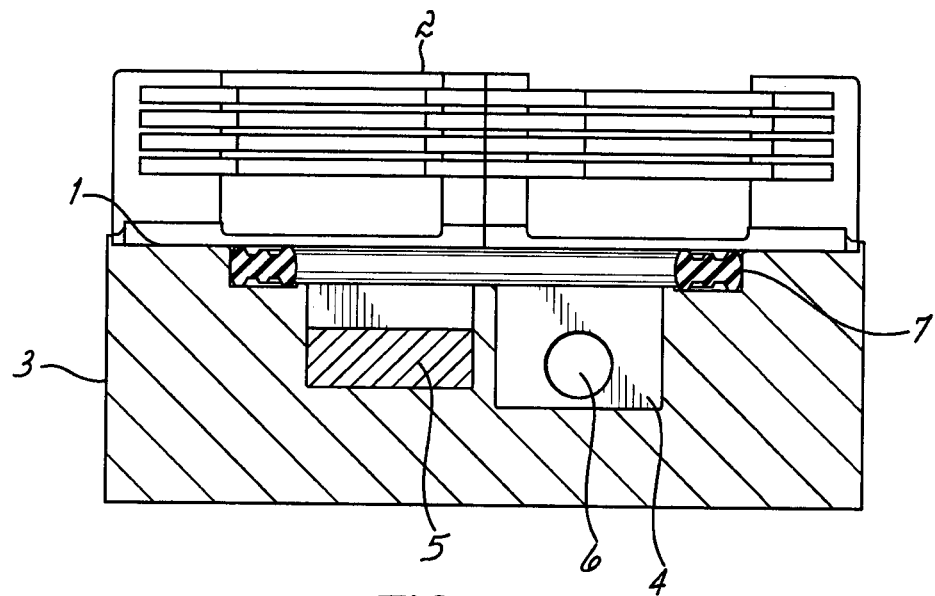
FIG. 4 shows cross section of the heat sink with a slope and power module mounted on top of the heat sink.

FIG. 4 shows a simplified embodiment of the present invention. The heat sink 3 with two chambers in the basin 4 and an inlet 6 for liquid coolant 5. There is a recess for receiving a gasket 7 and the contact rim 1 is having an angle inwards to the basin. On top of the heat sink 3 the power module 2 is mounted.

Figure 5:
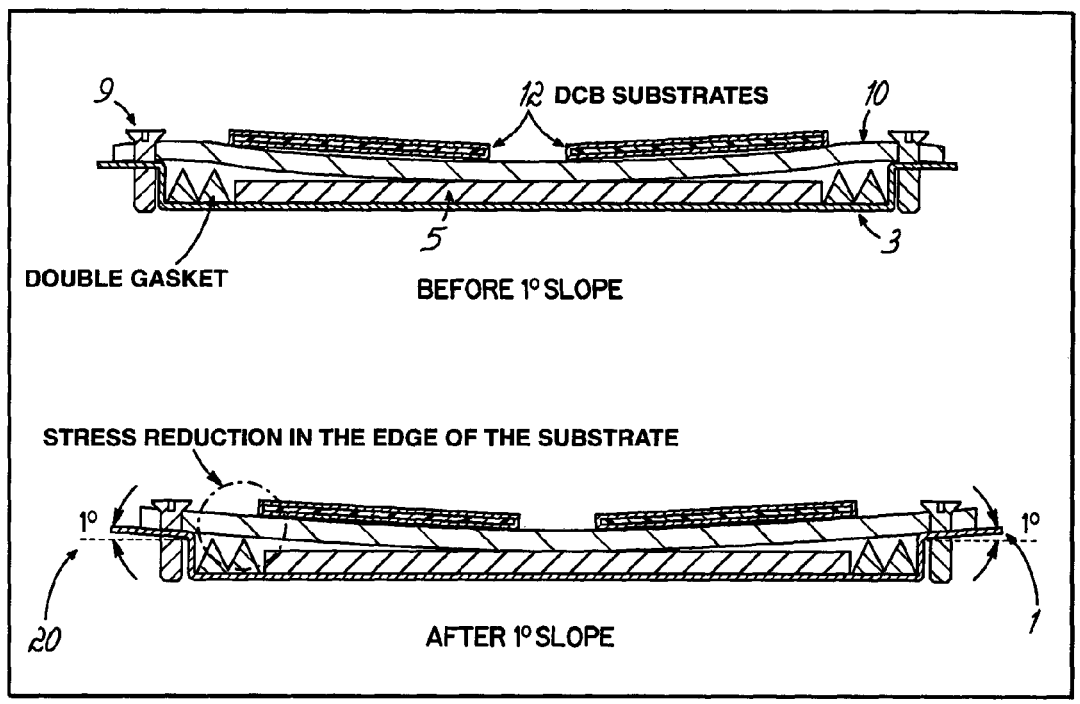
FIG. 5 shows the principle of the effect of the slope, upper part of the figure with out slope and lower figure with the slope.

A disadvantage of the gasket is that the surface touching the IGBT baseplate 10 exerts some pressure in vertical upward direction and acts as a fulcrum, levering a part of the IGBT baseplate as shown in FIG. 5.

The upper part of FIG. 5 shows the prior art with the old design, where the base plate 10 is attached by screws 9 to a flat rim 1, the DCB substrate 12 cracks when then base plate 10 bends due to the high stress level.

The lower part of FIG. 5 shows a design with the present invention where the rim 1 has a sloped angle 20 of 1 degree, the angle may be in the range of 0.1 degrees to 3 degrees, and more narrow in the range of 0.5 degrees to 1.5 degrees.

Figure 6:
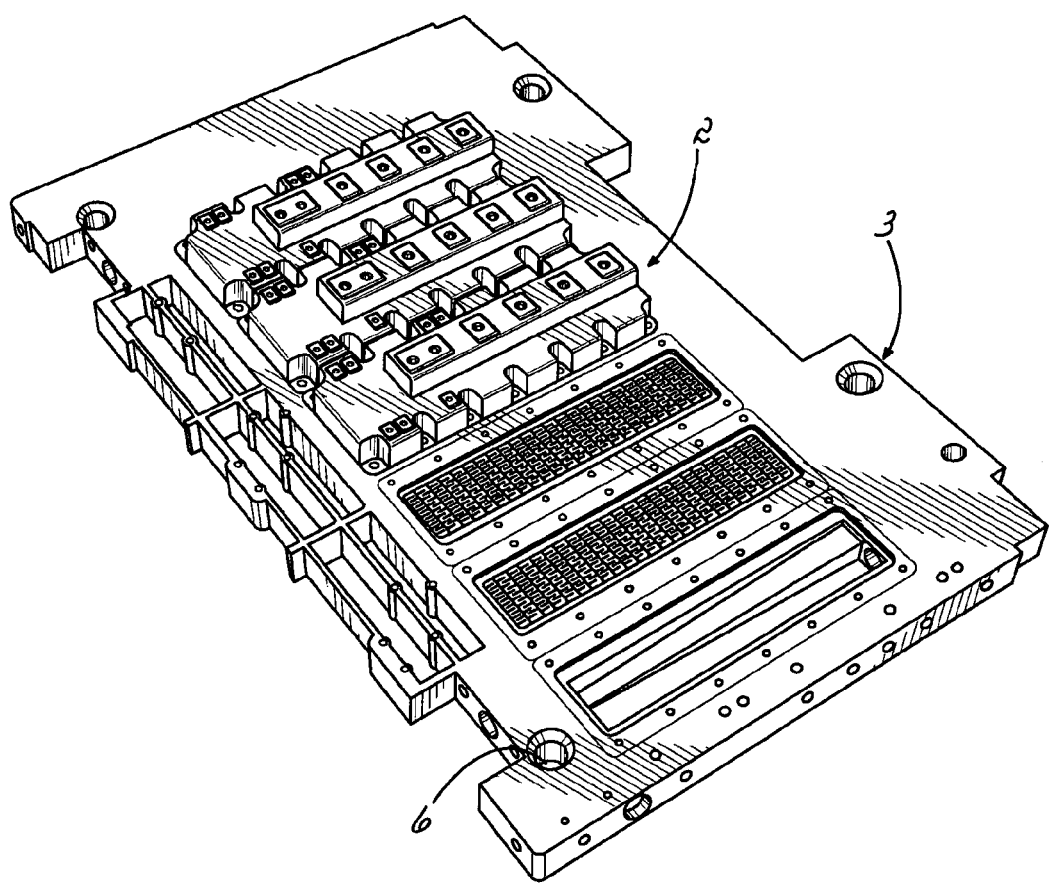
FIG. 6 shows a heat sink with room for six power semiconductor modules fitted to a direct-cooled heat sink in a wind turbine converter application

FIG. 6 shows an embodiment of the present invention with a heat sink 3 with six basins for receiving six power modules 2. Such a heat sink may have common inlet 6 and outlet 6 for the liquid coolant 5.

Figure 7:
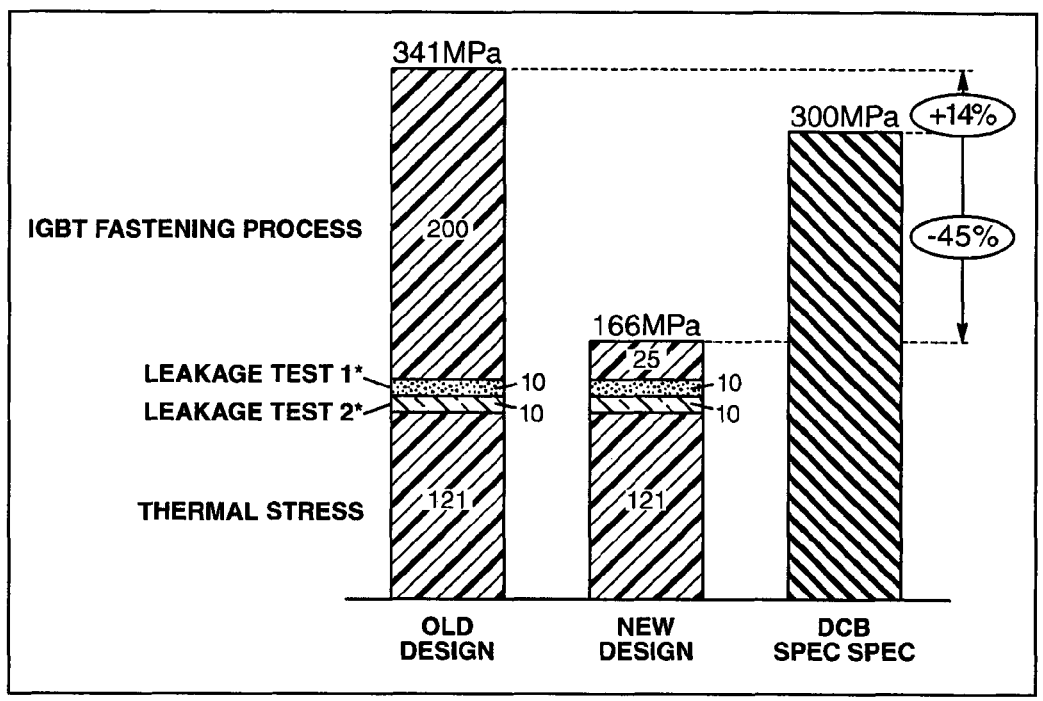
FIG. 7 shows a reduction in tensile stress due to proposed heat sink design, in this embodiment with a 1 deg slope. Test results show that the stress on the plate is reduced more than 50% compared to a design without the sloped upper surface.

FIG. 7 shows a reduction in tensile stress due to proposed heat sink design, in this embodiment with a slope with a 1 deg angle 20. The column to the left shows the stress of the design without a sloped rim 1. The thermal stress is 121 MPa and the IGBT/power module fastening process contributes with 200 MPa. The middle column show that test results with the new design with a sloped contact rim 1, the stress on the plate is reduced more than 50% compared to a design without the sloped upper surface, now with the same thermal stress, but the contribution from the fastening is down to 25 MPa. The right column show the limit of the actual DCB spec, which here is 300 MPa, the old design with a flat rim exceeded the specification limit with 14%, whereas the new design with a sloped rim 1 is 45% lower than the specification.

In one embodiment of the present invention the heat sink is made of metal, preferably Aluminum; other metals or alloys would also work. In some applications the actual heat sink also gives the structural strength of the power converter in which the semiconductor power module is used. The heat sink can be used for support of a DC link busbar and other peripheral components.

In another embodiment the heat sink is made of molded hardened polymer material, this allows for a cheap and light weight design. For an in-direct cooling system it is important that the specific heat capacity of the heat sink material is high in order dissipate the heat, for a direct cooling heat sink system this is not the case as the coolant is in direct contact with the element to be cooled. Thus a polymer heat sink will be sufficient.

A plastic heat sink can be made of various types of polymer. The strength of the polymer may vary from type of polymer or plastic.

In yet another embodiment the heat sink is made of a fibre-reinforced polymer. A polymer is generally manufactured by polycondensation, polymerization or polyaddition. When combined with various agents to enhance or in any way alter the material properties of polymers the result is referred to as a plastic. Composite plastics refer to those types of plastics that result from bonding two or more homogeneous materials with different material properties to derive a final product with certain desired material and mechanical properties.

Fibre reinforced plastics are a category-of composite plastics that specifically use fibrous materials to mechanically enhance the strength and elasticity of plastics. The original plastic material without fibre reinforcement is known as the matrix. The matrix is a tough but relatively weak plastic that is reinforced by stronger stiffer reinforcing filaments or fibres. The extent that strength and elasticity are enhanced in a fibre reinforced plastic depends on the mechanical properties of the fibre and matrix, their volume relative to one another, and the fibre length and orientation within the matrix. Reinforcement of the matrix occurs by definition when the FRP material exhibits increased strength or elasticity relative to the strength and elasticity of the matrix alone.

Other embodiments may include a combination of the above mentioned embodiments, where the heat sink is partly made polymer with a build in metal structure to give the support, here the metal structure can be in-mould or attach on the outer surface of the polymer/plastic part of the heat sink.

The moulded part may also included treaded metal pieces for attaching or receiving screws or bolts.

In summary the invention relates to, a heat sink for cooling at least one power semiconductor module with a base plate, the heat sink comprising a basin for containing a cooling liquid, the basin comprises a contact rim around the basin for receiving said base plate, the contact rim has a slope inwards to the basin.

Any range or device value given herein may be extended or altered without losing the effect sought, as will be apparent to the skilled person.

It should be understood that aspects of the invention are described herein with reference to the figures, which show illustrative embodiments in accordance with aspects of the invention. The illustrative embodiments described herein are not necessarily intended to show all aspects of the invention, but rather are used to describe a few illustrative embodiments. Thus, aspects of the invention are not intended to be construed narrowly in view of the illustrative embodiments. In addition, it should be understood that aspects of the invention may be used alone or in any suitable combination with other aspects of the invention.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

The invention claimed is:

1. A heat sink for cooling at least one power semiconductor module mounted to a first surface of a base plate, wherein the base plate includes a second surface opposite the first surface, the heat sink comprising:
    a basin for containing a cooling liquid; and
    a contact rim arranged around the basin, wherein the contact rim has a flat surface that slopes inwards to the basin, and wherein the flat surface of the contact rim receives the second surface of the base plate,
    wherein the basin further comprises a recessed rim for receiving a gasket, wherein the recessed rim is arranged between the basin and the contact rim.

2. The heat sink of claim 1, wherein the flat slope corresponds to a convex bending of the base plate of the at least one power semiconductor module.

3. The heat sink of claim 1, wherein the angle of the flat slope is in the range of 0.1 degrees to 3 degrees.

4. The heat sink of claim 1, wherein the angle of the flat slope is in the range of 0.5 degrees to 1.5 degrees.

5. The heat sink of claim 1, wherein the basin has an inlet and an outlet for allowing circulation of the liquid coolant.

6. The heat sink of claim 1, wherein the gasket is made with a double gasket containing an inner and an outer gasket.

7. The heat sink of claim 6, wherein the gasket is made of EPDM rubber with a plastic carrier.

8. The heat sink of claim 1, wherein the heat sink comprises at least two basins.

9. The heat sink of claim 1, wherein the heat sink is made of a metal.

10. The heat sink of claim 1, wherein the heat sink is made of molded plastic.

11. The heat sink of claim 10, wherein the molded heat sink is made with a fibre reinforced plastic.

12. The heat sink of claim 1, wherein the heat sink is made partly of plastic and partly of metal.

13. The heat sink of claim 1, further comprising:
a flow distributing element inserted in the basin.

* * * * *

UNITED STATES PATENT AND TRADEMARK OFFICE
CERTIFICATE OF CORRECTION

PATENT NO. : 9,666,504 B2  
APPLICATION NO. : 14/125255  
DATED : May 30, 2017  
INVENTOR(S) : Abeyasekera et al.

Page 1 of 1

It is certified that error appears in the above-identified patent and that said Letters Patent is hereby corrected as shown below:

On the Title Page

(75) Inventors:
Please delete "Thomas Lundgren Anderson, Hinnerup (DK)" and insert -- Thomas Lundgren Andersen, Hinnerup (DK) -- therefor.

Signed and Sealed this
Fourteenth Day of August, 2018

Andrei Iancu
*Director of the United States Patent and Trademark Office*